(12) United States Patent
Zitzlsperger et al.

(10) Patent No.: US 9,048,393 B2
(45) Date of Patent: Jun. 2, 2015

(54) OPTOELECTRONIC COMPONENT

(75) Inventors: Michael Zitzlsperger, Regensburg (DE); Eckhard Ditzel, Linsengericht (DE); Jörg Erich Sorg, Regensburg (DE)

(73) Assignees: OSRAM Opto Semiconductor GmbH (DE); Heraeus Materials Technology GmbH & Co. KG (DE)

( * ) Notice: Subject to any disclaimer, the term of this patent is extended or adjusted under 35 U.S.C. 154(b) by 204 days.

(21) Appl. No.: 13/377,910

(22) PCT Filed: May 28, 2010

(86) PCT No.: PCT/EP2010/057442
§ 371 (c)(1),
(2), (4) Date: Feb. 22, 2012

(87) PCT Pub. No.: WO2011/000642
PCT Pub. Date: Jan. 6, 2011

(65) Prior Publication Data
US 2012/0139003 A1  Jun. 7, 2012

(30) Foreign Application Priority Data
Jun. 29, 2009 (DE) .......................... 10 2009 031 008

(51) Int. Cl.
*H01L 33/58* (2010.01)
*H01L 33/48* (2010.01)
*H01L 33/52* (2010.01)
(Continued)

(52) U.S. Cl.
CPC ............... *H01L 33/486* (2013.01); *H01L 33/38* (2013.01); *H01L 33/52* (2013.01); *H01L 33/54* (2013.01); *H01L 2224/48091* (2013.01)

(58) Field of Classification Search
CPC ......... H01L 33/38; H01L 33/48; H01L 33/52; H01L 33/54; H01L 33/98
USPC .......................... 257/98, 79, 99, 100, E33.059
See application file for complete search history.

(56) References Cited

U.S. PATENT DOCUMENTS

| 6,610,563 B1 | 8/2003 | Waitl et al. |
| 6,660,559 B1 | 12/2003 | Huemoeller et al. |

(Continued)

FOREIGN PATENT DOCUMENTS

| EP | 1 770 796 A1 | 9/2006 |
| EP | 1 978 566 A1 | 10/2008 |

(Continued)

OTHER PUBLICATIONS

The Japanese Examination Report dated Jan. 6, 2014 for corresponding Japanese Patent Application No. 2012-518844.

Primary Examiner — Minchul Yang
(74) Attorney, Agent, or Firm — DLA Piper LLP (US)

(57) ABSTRACT

An optoelectronic component including a connection carrier including an electrically insulating film at a top side of the connection carrier, an optoelectronic semiconductor chip at the top side of the connection carrier, a cutout in the electrically insulating film which encloses the optoelectronic semiconductor chip, and a potting body surrounding the optoelectronic semiconductor chip, wherein a bottom area of the cutout is formed at least regionally by the electrically insulating film, the potting body extends at least regionally as far as an outer edge of the cutout facing the optoelectronic semiconductor chip, and the cutout is at least regionally free of the potting body.

17 Claims, 5 Drawing Sheets

(51) Int. Cl.
   *H01L 33/54* (2010.01)
   *H01L 33/38* (2010.01)

(56) References Cited

U.S. PATENT DOCUMENTS

| | | |
|---|---|---|
| 6,765,801 B1 | 7/2004 | Glenn et al. |
| 2007/0029569 A1 | 2/2007 | Andrews |
| 2007/0080337 A1 | 4/2007 | Sorg |
| 2008/0029775 A1 | 2/2008 | Liu et al. |
| 2008/0054286 A1 | 3/2008 | Loh et al. |
| 2008/0122123 A1 | 5/2008 | Pang |
| 2009/0152582 A1* | 6/2009 | Chang et al. ............ 257/98 |

FOREIGN PATENT DOCUMENTS

| | | |
|---|---|---|
| JP | 2003-258313 | 9/2003 |
| JP | 2009-503888 | 1/2009 |
| WO | 2007/018560 A1 | 2/2007 |

* cited by examiner

US 9,048,393 B2

OPTOELECTRONIC COMPONENT

RELATED APPLICATIONS

This is a §371 of International Application No. PCT/EP2010/057442, with an international filing date of May 28, 2010 (WO 2011/000642, published Jan. 6, 2011), which is based on German Patent Application No. 10 2009 031 008.8, filed Jun. 29, 2009, the subject matter of which is incorporated by reference.

TECHNICAL FIELD

This disclosure relates to an optoelectronic component which can be produced particularly simply and cost-effectively.

SUMMARY

We provide an optoelectronic component including a connection carrier including an electrically insulating film at a top side of the connection carrier, an optoelectronic semiconductor chip at the top side of the connection carrier, a cutout in the electrically insulating film which encloses the optoelectronic semiconductor chip, and a potting body surrounding the optoelectronic semiconductor chip, wherein a bottom area of the cutout is formed at least regionally by the electrically insulating film, the potting body extends at least regionally as far as an outer edge of the cutout facing the optoelectronic semiconductor chip, and the cutout is at least regionally free of the potting body.

DETAILED DESCRIPTION

Figure 1A:
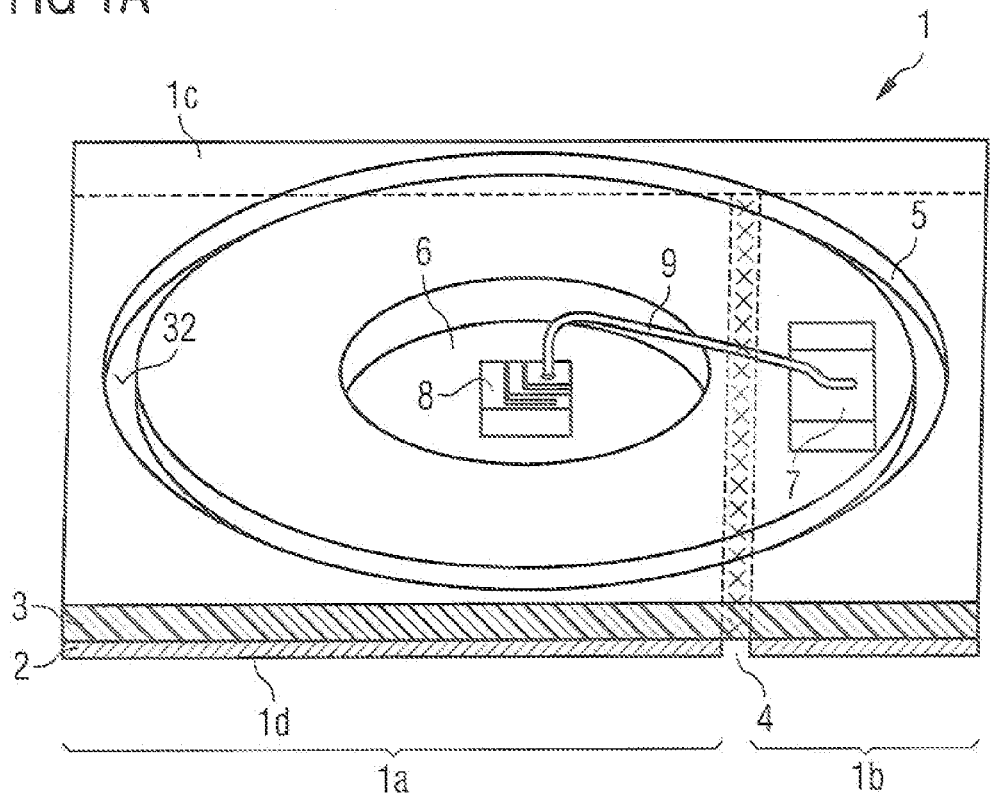
FIGS. 1A to 1C show schematic views of an optoelectronic component described here in accordance with an example.

The optoelectronic component may comprise a connection carrier. The connection carrier is a printed circuit board, for example, on which or in which connection locations and conductor tracks for connecting and making contact with electronic components are provided. The connection carrier comprises an electrically insulating film at a top side of the connection carrier. The electrically insulating film is a layer composed of an electrically insulating material. By way of example, the electrically insulating film is a plastic film.

The optoelectronic component may comprise an optoelectronic semiconductor chip arranged on the connection carrier at the top side of the connection carrier. The optoelectronic semiconductor chip is, for example, a radiation-emitting semiconductor chip such as a light-emitting diode chip or a laser diode chip. Furthermore, the optoelectronic semiconductor chip can also be a radiation-receiving semiconductor chip such as, for example, a photodiode chip.

The optoelectronic component may comprise a cutout in the electrically insulating film which encloses the optoelectronic semiconductor chip in a frame-like manner. That is to say that a cutout is introduced into the electrically insulating film at the top side of the connection carrier. The cutout can be produced for example by material removal, that is to say by removal of part of the electrically insulating film. In this case, the cutout encloses the optoelectronic semiconductor chip in a frame-like manner. In this case, the expression "in a frame-like manner" should not be understood as restrictive with regard to the form and the course of the cutout. By way of example, the cutout can have a round, oval or rectangular form. The cutout can be, for example, a trench in the electrically insulating film that completely encloses the optoelectronic semiconductor chip. A region of the electrically insulating film that is not structured can then be situated between the optoelectronic semiconductor chip and the cutout. That is to say that the electrically insulating film is then intact in the region.

The optoelectronic component may comprise a potting body surrounding the optoelectronic semiconductor chip. The optoelectronic semiconductor chip is covered by the potting body at its exposed areas, that is to say at the areas which do not adjoin the connection carrier. By way of example, the potting body is situated there in direct contact with the semiconductor chip. The potting body is preferably transmissive to an electromagnetic radiation to be emitted by the optoelectronic semiconductor chip or to an electromagnetic radiation to be received by the optoelectronic semiconductor chip. By way of example, the potting body contains or consists of a silicone.

A bottom area of the cutout in the electrically insulating film may be formed at least regionally by the electrically insulating film. That is to say that, at least regionally, the cutout does not completely penetrate through the electrically insulating film, rather, in the region of the cutout, the electrically insulating film is only removed as far as a specific depth and the bottom area of the cutout is then formed by non-removed regions of the electrically insulating film. In this case, it is possible, in particular, for the cutout not to penetrate through the electrically insulating film anywhere. That is to say that the electrically insulating plastic layer is then only partly removed. It is not perforated by the cutout. This for example prevents material, for example, material of the potting body from the top side of the connection carrier from passing to an underside of the connection carrier, facing away from the top side, through the cutout. This has the advantage that, for example, contamination of the underside of the connection carrier, at which, for example, electrical connection locations for making contact with the optoelectronic component can be situated, is prevented.

The potting body may extend at least regionally as far as an outer edge of the cutout facing the optoelectronic semiconductor chip. In other words, the potting body is in contact at least regionally with an outer edge of the cutout facing the optoelectronic semiconductor chip. In this case, the outer edge of the cutout acts as a stop edge for the material of the potting body. So that the outer edge of the cutout fulfills the function as a stop edge, the outer edge is preferably not rounded, but rather has a corner, extending for example at an angle of 90° or an angle of less than 90°. That is to say that the outer edge is sharply defined and has no rounding portions, no nicks or notches.

The cutout may be at least regionally free of the potting body. That is to say that the potting body does not enter into the cutout at least at some locations of the cutout. Preferably, the cutout is free or substantially free of the potting body. In this case, "substantially free" means that, in a manner governed by production, small amounts of material of the potting body can be present in the cutout, but the material of the potting body fills at most 5% of the volume, preferably at most 2.5%, particularly preferably at most 1%, of the volume of the cutout. In particular, a bottom area of the cutout is preferably free of the potting body. That is to say that material of the potting body can, under certain circumstances, be present at the side areas of the cutout which bound the cutout, but the cutout is not filled with the material of the potting body and is thus at least regionally, preferably completely, free of the potting body.

The optoelectronic component may comprise a connection carrier comprising an electrically insulating film at a top side of the connection carrier, an optoelectronic semiconductor chip at the top side of the connection carrier, a cutout in the electrically insulating film which encloses the optoelectronic semiconductor chip in a frame-like manner, and a potting body surrounding the optoelectronic semiconductor chip. In this case, the bottom area of the cutout is formed at least regionally by the electrically insulating film. The potting body extends at least regionally as far as an outer edge of the cutout facing the optoelectronic semiconductor chip, and the cutout is at least regionally free of the potting body.

The potting body may extend along the entire cutout to the outer edge of the cutout facing the optoelectronic semiconductor chip. That is to say that the cutout enclosing the semiconductor chip in a frame-shaped manner acts as a stop edge for the potting body. In this way, the form of the potting body, in the main extension plane of the electrically insulating film, is predetermined by the course of the cutout. A high positioning accuracy of the potting body can advantageously be achieved in this way since the latter is independently positioned at the outer edge of the cutout. Depending on the form of the cutout, freely shaped contours of the potting body can be produced such as, for example, round, oval, rectangular or other forms. On account of the fact that the potting body positions itself by the cutout, particularly rapid and cost-effective production and a rapid and inexpensive change in the design of the optoelectronic component are possible. The design of the optoelectronic component can be adapted for example by a simple alteration of the use requirements specific to the shaping of the cutout. Finally, it is possible to produce optoelectronic components with particularly small distances between the potting bodies in an assemblage and to singulate the assemblage to form single optoelectronic components only after the potting bodies have been applied. On account of the positioning of the potting body by the cutout, it is possible to arrange adjacent optoelectronic components in the assemblage closer to one another than is the case, for example, if the potting body is produced by a mold on the connection carrier.

The connection carrier may comprise an electrically conducting film fixed to the electrically insulating film at that side of the electrically insulating film which faces away from the top side of the connection carrier. That is to say, the connection carrier is a two-layered carrier which, for example, can be embodied in a flexible manner. The electrically conducting film can be a film composed of a metal, for example an aluminum film or a copper film, which is fixed to the electrically insulating film. The electrically conductive film is situated at the underside of the connection carrier and forms for example the connection locations of the optoelectronic component. For this purpose, the electrically conductive film is structured into two or at least two regions electrically insulated from one another. These regions can be held together by the electrically insulating film. That is to say that the electrically insulating film gives the optoelectronic component the necessary mechanical stability.

The connection carrier may consist of the electrically conductive film, the electrically insulating film and, if appropriate, a connecting means, which can be arranged between the electrically conductive film and the electrically insulating film. The connecting means is an adhesive, for example. Electrically insulating film and electrically conductive film are adhesively bonded to one another by the connecting means in this case. However, it is also possible for the electrically insulating film and electrically conductive film to be the only layers of the connection carrier and for the connection carrier to be free of connecting means. In this case, the connection carrier is embodied as a laminate.

The potting body may be produced by dispensing or potting, wherein the outer edge of the cutout facing the optoelectronic semiconductor chip forms a stop edge for the potting body. In other words, the material of the potting body may be applied in the liquid or viscous state to the optoelectronic semiconductor chip and the connection carrier in the region which is delimited in a frame-like manner by the cutout in the electrically insulating film. The outer edge of the cutout facing the optoelectronic semiconductor chip forms the stop edge for the material of the potting body such that the form thereof is formed in the plane of the electrically insulating film in accordance with the course of the cutout. The geometry of the potting body then results from the amount, that is to say for example from the volume of the applied material, and also the surface tension of the material of the potting body, the surface energy of the film and also of the applied material, or the wetting angle. The circumferential line of the potting body in the plane of the electrically insulating film is defined by the outer edge of the cutout facing the semiconductor chip. The potting body is then formed—depending on the surface tension of the material used—convexly, that is to say in a dome-like manner, and its outer area has the form of a spherical or aspherical lens.

The cutout may be produced by a laser beam. That is to say that, in a method for producing the optoelectronic component, first, the cutout described here is introduced into the electrically insulating film by a laser beam, and the potting body can subsequently be produced by dispensing, wherein the outer edge of the cutout produced by laser radiation forms a stop edge for the potting body. The material of the potting body is subsequently cured such that a mechanically stable potting body arises around the optoelectronic semiconductor chip.

The cutout may have a rectangular cross section. That is to say that the bottom area and also the side areas of the cutout form in cross section a rectangle which, however, is not closed at its side facing away from the bottom areas. The cutout is therefore introduced into the electrically insulating film for example as a trench that is rectangular in cross section. We found in this case that such cutouts having particularly sharp outer edges can be produced particularly precisely and efficiently by removal of the material of the electrically insulating film by a laser beam.

The optoelectronic component described here is explained in greater detail below on the basis of examples and the associated figures.

Elements that are identical, of identical type or act identically are provided with the same reference symbols in the figures. The figures and the size relationships of the elements illustrated in the figures among one another should not be regarded as to scale. Rather, individual elements may be illustrated with an exaggerated size to enable better illustration and/or to afford a better understanding.

FIG. 1A shows an example of an optoelectronic component described here in a schematic perspective illustration without a potting body.

The optoelectronic component comprises a connection carrier 1. The connection carrier 1 consists, for example, precisely of two layers. The connection carrier 1 then consists of an electrically conductive layer 2, which is embodied as a copper film, for example. Furthermore, the connection carrier 1 comprises an electrically insulating film 3, which is a plastic film, for example. A connecting means 12 can be situated between electrically insulating film 3 and electrically conductive film 2, the connecting means imparting a mechanical connection between the two films 2, 3. In this case, the electrically insulating film contains or consists for example of one of the following materials: polyimide, glass fiber reinforced epoxy, silicone, polymethacrylamide. The film 3 can also be a film composite composed of glass fiber reinforced epoxy with a cover layer composed of polytetrafluoroethylene or polyetherimide. Furthermore, it is possible for material such as one of the materials mentioned, for example, to be applied to the glass fiber reinforced epoxy by printing.

Figure 1B:
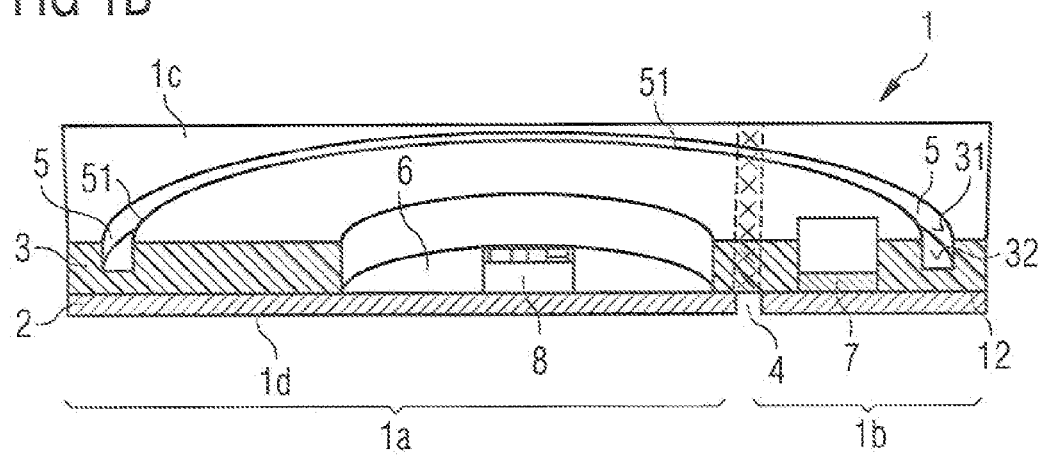
Figure 1C:
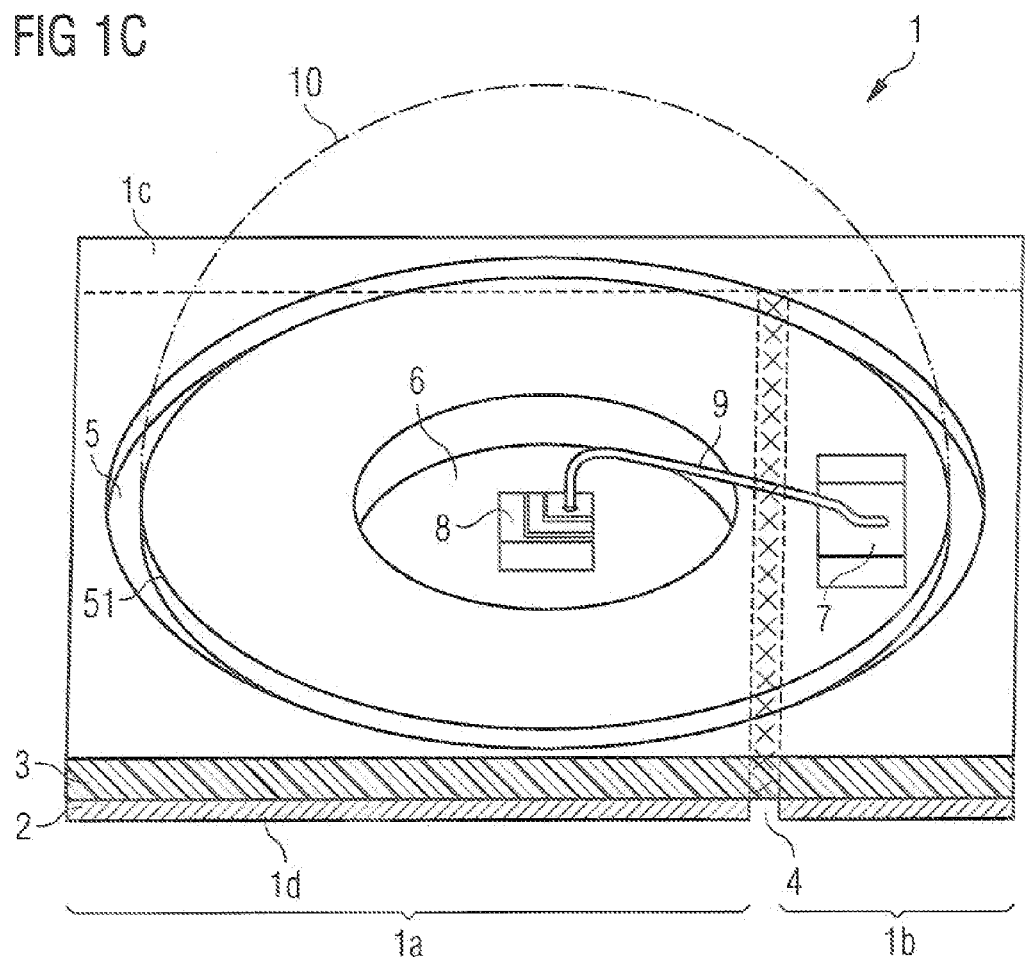
Figure 2A:
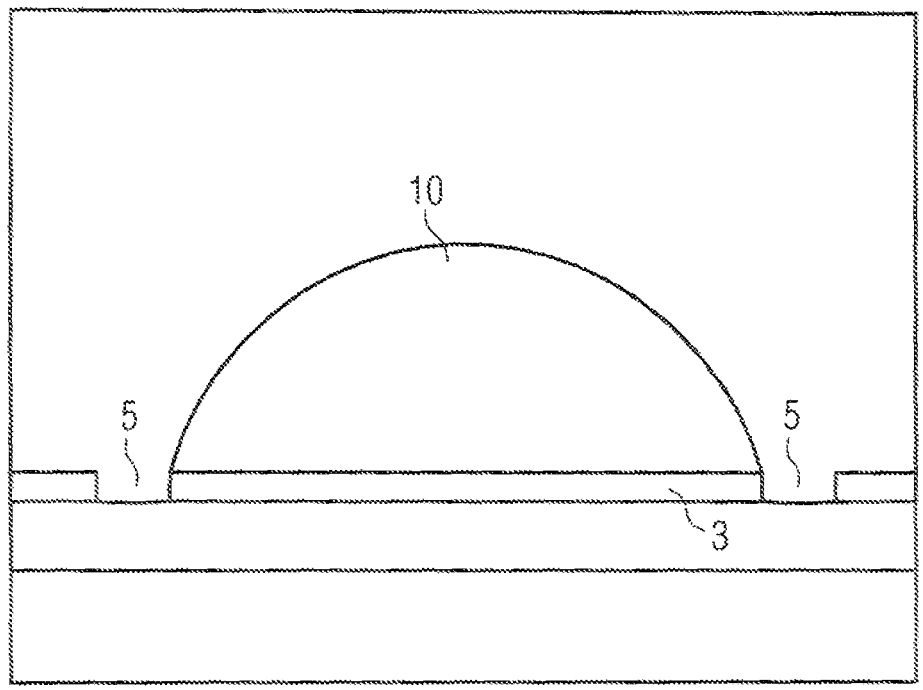
FIGS. 2A to 2F show micrographs of a potting body such as can be used in an optoelectronic component described here.
Figure 2B:
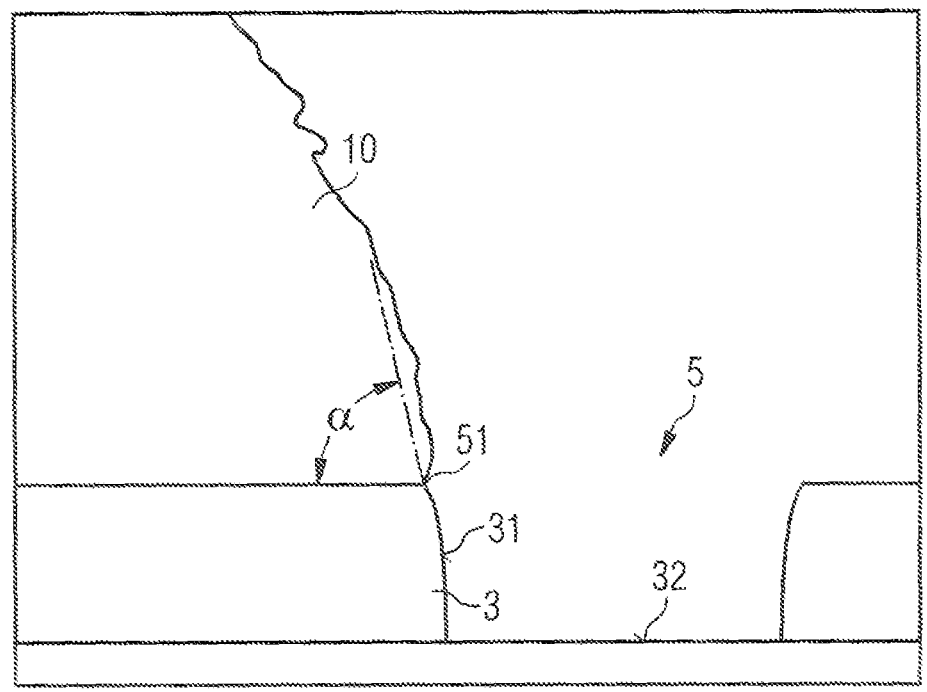
Figure 2C:
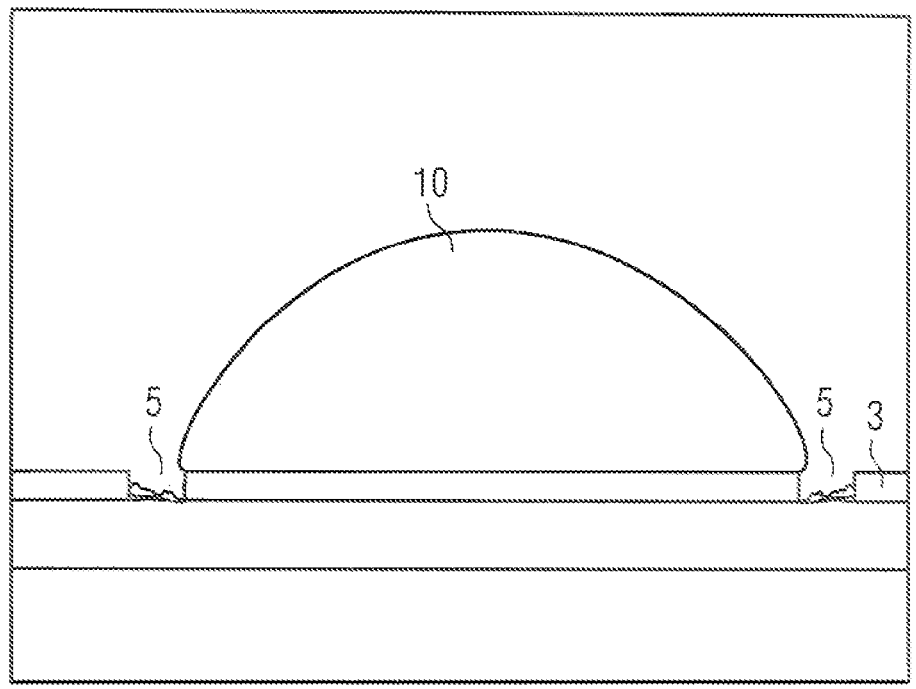
Figure 2D:
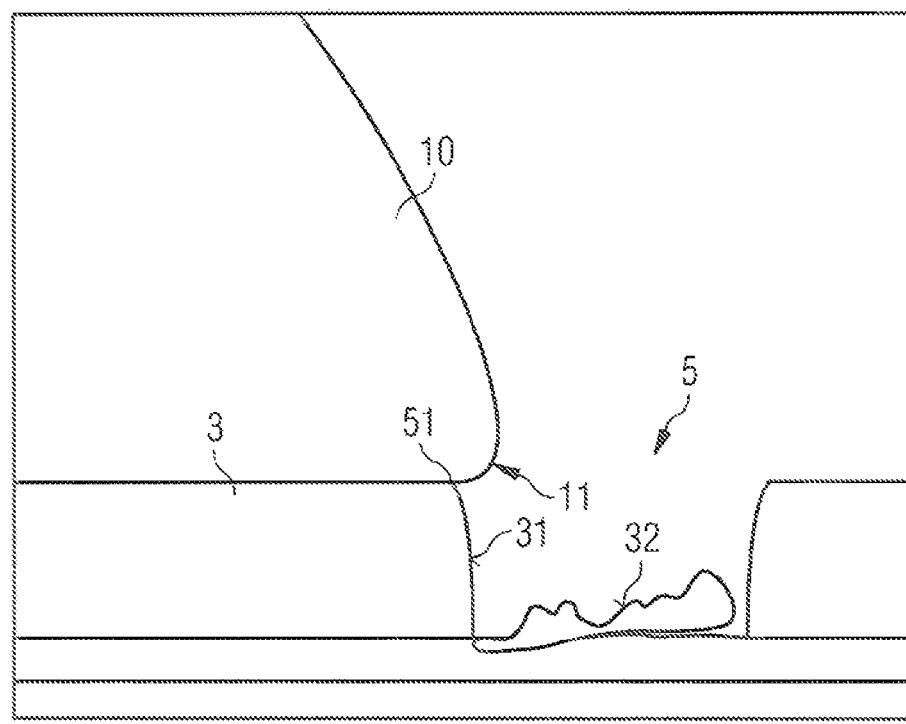
Figure 2E:
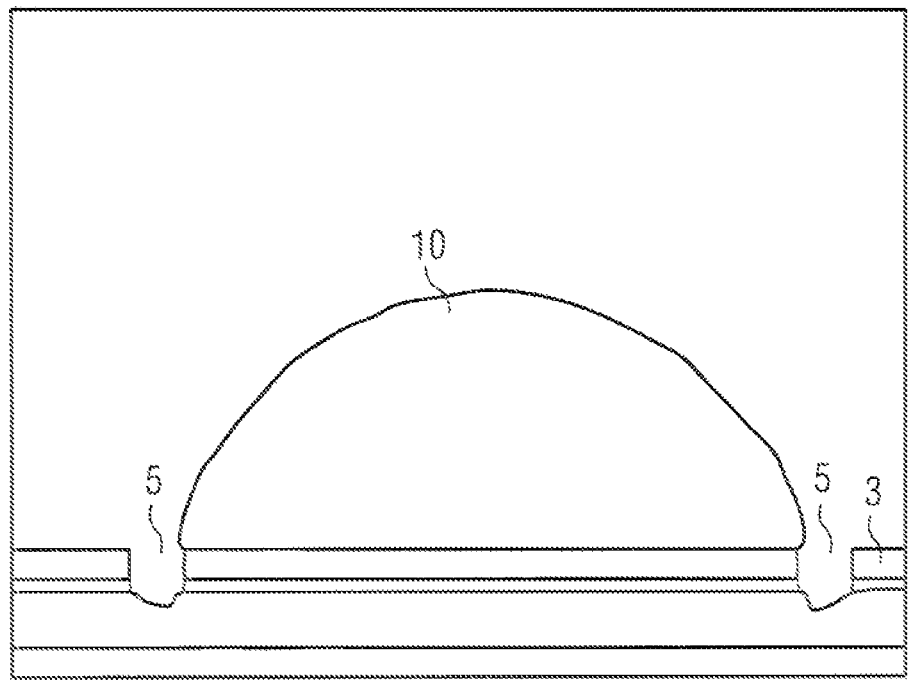
Figure 2F:
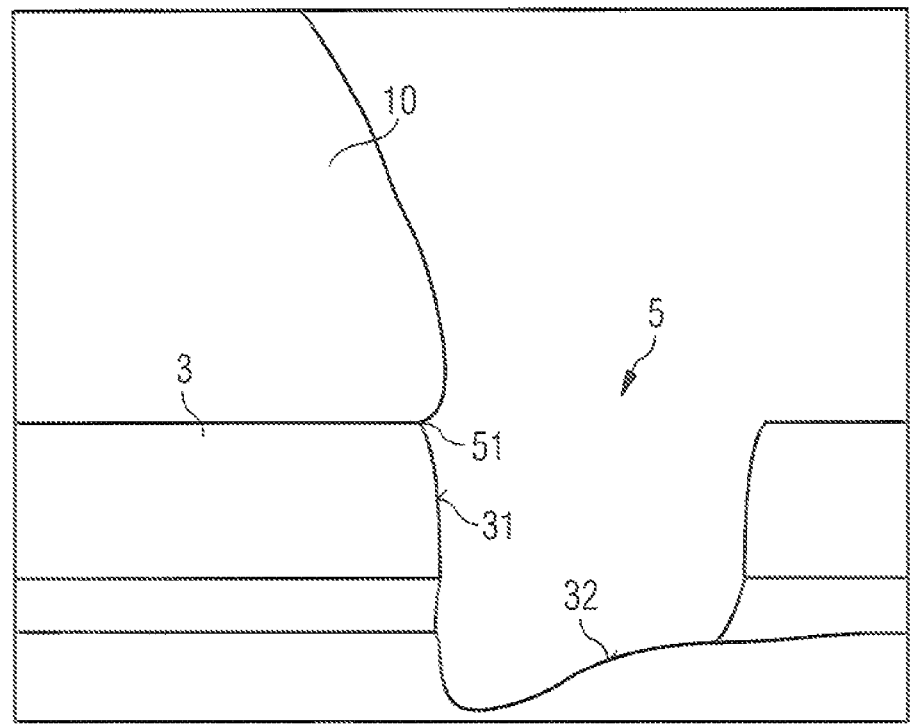

The electrically conductive film 2 has two regions electrically insulated from one another (also see the separating line indicated in FIGS. 1A, 1B, 1C). The regions of the electrically conductive film 2 are held together mechanically by the electrically insulating film 3. In this way, the connection carrier 1 is laterally subdivided into a first partial region 1a and a second partial region 1b in which the connection locations of the optoelectronic component that are formed by the electrically conductive film 2 are situated at the underside 1d of the connection carrier.

At the top side 1c, the connection carrier 1 has a first connection region 6 in which the electrically insulating film 3 is removed. The optoelectronic semiconductor chip 8 is arranged in this first connection region 6. Furthermore, the connection carrier 1 has at its top side 1c a second connection region 7, in the region of which the electrically insulating film 3 is likewise removed. The second connection region 7 serves, for example, for electrically connecting the semiconductor chip 8 by a bonding wire 9. Around the optoelectronic semiconductor chip 8 and the first connection region 6 and the second connection region 7, the cutout 5 is introduced into the electrically insulating film 3 which cutout is rectangular in cross section and the bottom area 32 and the side areas 31 of which cutout are formed by the electrically insulating film 3. That is to say that the cutout does not completely penetrate through the electrically insulating film, unlike in the first and second connection regions 6 and 7, rather a residue of electrically insulating film 3 remains at the bottom area 32 of the cutout. This has the advantage that, for example, material of the potting body 10, in this respect see FIG. 1C, cannot pass through the cutout 5 to the underside 1d of the connection carrier 1 where it could contaminate for example the connection locations, that is to say the electrically conductive film 2.

The potting body 10 is applied by dispensing, that is to say in the liquid or viscous state, into that region of the connection carrier 1 which is structured by the cutout 5, at the surface 1c of the connection carrier and is subsequently cured.

The micrographs in FIGS. 2A to 2E show sections through a potting body 10 which, for example, is formed from a silicone and arranged on an electrically insulating layer 3. The outer edge 51 of the cutout 5, which faces the optoelectronic semiconductor chip 8, acts as a stop edge for the material of the potting body 10. The potting body 10 can contain one of the following materials or consist of one of the following materials: silicone, polyurethane.

In this case, the material of the electrically insulating layer 3 and the material of the potting body 10 are chosen such that the contact angle α is at least 10°. We found that, for such large contact angles, the requirements made of the quality of the outer edge 51, that is to say, in particular, the sharpness thereof, are so low that economic production of the cutout, for example by laser radiation, is possible.

A UV-curing material is preferably used as a material for the potting body 10. The advantage of the use of the UV-curing material over a thermally curing material is that the viscosity of the material of the potting body 10 is not reduced on account of the action of temperature during the curing of the material. UV-curing materials polymerize completely or partly at room temperature or slightly increased temperatures. The risk of material of the potting body 10 passing into the cutout 5 and thereby adversely influencing the form of the potting body 10 is thus reduced.

A further possibility for improving the stability of the dispensed potting body 10 consists in targeted rheological change before the potting body 10 is cured. For example, by introducing particles or alternatively very greatly branched molecules, it is possible to raise the viscosity of the material of the potting body 10 and/or to incorporate a yield point. These measures counteract flowing-apart of the potting body 10 before curing. By way of example, at least one of the following materials can be used as a thixotropic agent: $SiO_2$, for example as pyrogenic silicic acids, $Al_2O_3$, zeolite, $Al(OH)_3$.

When matching electrically insulating layer 3 and material of the potting body 10 to one another, targeted adaptations of the surface wetting properties of the materials used can be advantageous. This can be effected by chemical additives. Additives which increase the contact angle (wetting angle) and at the same time do not adversely influence the curing behavior and the material properties of the material of the potting body 10 are suitable.

This disclosure is not restricted to the examples by the description on the basis of the examples. Rather, the disclosure encompasses any novel feature and also any combination of features, which in particular includes any combination of features in the appended claims, even if the feature or the combination itself is not explicitly specified in the claims or examples.

The invention claimed is:

1. An optoelectronic component comprising:
a connection carrier comprising an electrically insulating film at a top side of the connection carrier,
an electrically conducting film,
an optoelectronic semiconductor chip at the top side of the connection carrier,
a cutout in the electrically insulating film which encloses the optoelectronic semiconductor chip, and
a potting body surrounding the optoelectronic semiconductor chip, wherein
a bottom area of the cutout is formed at least regionally by the electrically insulating film,
the potting body extends at least regionally as far as an outer edge of the cutout facing the optoelectronic semiconductor chip,
the cutout is at least regionally free of the potting body,
the electronically conducting film comprising at least two regions insulated from each other and held together by the electrically insulating film,
the electrically insulating film completely covers the electrically conducting film at a top side apart from a first connection region and a second connection region,
the optoelectronic semiconductor chip is arranged on the electrically conducting film in the first connection region,
the optoelectronic semiconductor chip is electrically contact connected to the electrically conducting film in the second connection region,
the cutout encloses the first and the second connection regions, and
wherein the electrically insulating film covers the electrically conducting film exclusively at the top side.

2. The optoelectronic component according to claim 1, wherein the cutout is substantially free of the potting body.

3. The optoelectronic component according to claim 1, wherein the potting body extends along an entirety of the cutout to the outer edge of the cutout facing the optoelectronic semiconductor chip.

4. The optoelectronic component according to claim 1, wherein the cutout does not penetrate through the electrically insulating film.

5. The optoelectronic component according to claim 1, wherein the connection carrier comprises an electrically conducting film fixed to the electrically insulating film at a side of the electrically insulating film facing away from the top side of the connection carrier.

6. The optoelectronic component according to claim 1, wherein the connection carrier consists of the electrically conductive film, the electrically insulating film and a connector, wherein the connector is arranged between the electrically conductive film and the electrically insulating film.

7. The optoelectronic component according to claim 1, wherein the potting body is produced by dispensing and the outer edge of the cutout forms a stop edge for the potting body.

8. The optoelectronic component according to claim 1, wherein the cutout is produced by a laser beam.

9. The optoelectronic component according to claim 1, wherein the cutout has a rectangular cross section.

10. The optoelectronic component according to claim 1, wherein the electrically insulating film is at least one material selected from the group consisting of: polyimide, glass fiber reinforced epoxy, silicone and polymethacrylimide.

11. The optoelectronic component according to claim 1, wherein the electrically insulating film is a film composite comprising glass fiber reinforced epoxy with a cover layer comprising polytetrafluoroethylene or polyetherimide.

12. The optoelectronic component according to claim 1, wherein the electrically insulating film is the mechanically stabilizing element of the optoelectronic component.

13. The optoelectronic component according to claim 1, wherein the electrically insulating film spans the at least two regions of the electrically conducting film insulated from each other.

14. The optoelectronic component according to claim 1, wherein material of the electrically insulating film is arranged between the first connection region and the second connection region.

15. The optoelectronic component according to claim 1, wherein both the electrically insulating film and the electrically conductive film are foil.

16. An optoelectronic component comprising:
a connection carrier comprising an electrically insulating film and an electrically conducting film with a connection face, wherein a top side of the connection carrier is formed by an outside surface of the electrically insulating film facing away from the electrically conducting film;
an optoelectronic semiconductor chip;
a potting body surrounding the optoelectronic semiconductor chip at the top side of the connection carrier, and
a cutout in the electrically insulating film at the top side of the connection carrier, wherein
the cutout does not completely penetrate through the electrically insulating film at least regionally,
an outer edge of the cutout facing the optoelectronic semiconductor chip has the function of a stop edge for the potting body,
the cutout is at least regionally free of the potting body,
the potting body extends at least regionally as far as the stop edge,
the potting body is in direct physical contact with the top side of the connection carrier,
the electrically conducting film is structured into a first region and a second region that are electrically insulated from one another,
the electrically insulating film completely covers the connection face of the electrically conducting film apart from a first connection region of the first region and a second connection region of the second region,
the optoelectronic semiconductor chip is arranged on the connection face of the electrically conducting film and electrically contact-connected to the connection face of the electrically conducting film in the second connection region, and
the cutout encloses the first and the second connection regions.

17. An optoelectronic component comprising:
a connection carrier that consists of an electrically insulating film, a connector, and an electrically conductive film with a connection face, wherein a top side of the connection carrier is formed by an outside surface of the electrically insulating film facing away from the electrically conducting film,
an optoelectronic semiconductor chip,
a potting body surrounding the optoelectronic semiconductor chip at the top side of the connection carrier, and
a cutout in the electrically insulating film at the top side of the connection carrier, wherein
the cutout does not completely penetrate through the electrically insulating film at least regionally,
an outer edge of the cutout facing the optoelectronic semiconductor chip has the function of a stop edge for the potting body,
the cutout is at least regionally free of the potting body,
the potting body extends at least regionally as far as the stop edge, and
the connector is arranged between the electrically conductive film and the electrically insulating film.

* * * * *